US007474573B2

(12) United States Patent
Shin

(10) Patent No.: US 7,474,573 B2
(45) Date of Patent: Jan. 6, 2009

(54) SEMICONDUCTOR MEMORY DEVICE CAPABLE OF WRITING DIFFERENT DATA IN CELLS COUPLED TO ONE WORD LINE DURING BURN-IN TEST

(75) Inventor: Dong-Hak Shin, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 226 days.

(21) Appl. No.: 11/649,629

(22) Filed: Jan. 4, 2007

(65) Prior Publication Data

US 2007/0171743 A1 Jul. 26, 2007

(30) Foreign Application Priority Data

Jan. 24, 2006 (KR) .................. 10-2006-0007142

(51) Int. Cl.
*G11C 29/00* (2006.01)
(52) U.S. Cl. ............. 365/201; 365/185.22; 365/185.28; 365/189.09
(58) Field of Classification Search .......... 365/201, 365/185.22, 185.28, 189.09
See application file for complete search history.

(56) References Cited

U.S. PATENT DOCUMENTS 6,317,368 B1 * 11/2001 Taito et al. ............. 365/189.11

6,414,890 B2 * 7/2002 Arimoto et al. .......... 365/201

FOREIGN PATENT DOCUMENTS

| JP | 8-212798 | 8/1996 |
|---|---|---|
| KR | 1998-013923 | 5/1998 |
| KR | 1999-0048397 | 7/1999 |

* cited by examiner

*Primary Examiner*—Pho M. Luu
(74) *Attorney, Agent, or Firm*—Mills & Onello, LLP

(57) ABSTRACT

A semiconductor memory device includes a row decoder, a control circuit, and a memory cell array having an open bit-line structure. The memory cell array includes a plurality of word lines coupled to the row decoder, a plurality of bit lines, a plurality of memory cells, a plurality of sense amplifier blocks, and a plurality of burn-in voltage supply lines coupled to the plurality of sense amplifier blocks in a predetermined order, respectively. The control circuit controls the row decoder and the memory cell array for performing a burn-in test. During the burn-in test, the burn-in voltage supply lines are provided with at least two different burn-in voltages. The burn-in voltage supply lines respectively coupled to the sense amplifier blocks that are adjacent to each other are provided with different burn-in voltages during the burn-in test.

9 Claims, 5 Drawing Sheets

SEMICONDUCTOR MEMORY DEVICE CAPABLE OF WRITING DIFFERENT DATA IN CELLS COUPLED TO ONE WORD LINE DURING BURN-IN TEST

CROSS-REFERENCE TO RELATED APPLICATIONS

This application claims priority under 35 USC § 119 to Korean Patent Application No. 10-2006-0007142, filed in the Korean Intellectual Property Office on Jan. 24, 2006, the contents of which are herein incorporated by reference in their entirety.

BACKGROUND OF THE INVENTION

1. Field of the Invention

Example embodiments of the present invention relate to a semiconductor memory device, and more particularly to a semiconductor memory device capable of applying different voltages in cells coupled to one word line during a burn-in test.

2. Description of the Related Art

According to percent defective statistics of semiconductor devices, a percent defective of products that are manufactured at one time is initially high but becomes lower and stable after the lapse of time. When a product having a defect operates in extreme conditions, the defect is typically aggravated, so that the product itself becomes defective more rapidly than a normally operating product. Thus, an amount of time in which a percent defective of products as a whole becomes stable is required to be shortened. In this manner, a method for screening weak cells in semiconductor memory devices in advance by operating in extreme conditions is referred to as a burn-in test.

A burn-in test in semiconductor devices is performed at a high voltage and a high temperature. A defect due to a weak cell may be detected by applying a high voltage to a semiconductor memory device. Generally, a burn-in test is performed on a large number of cells simultaneously, so as to shorten testing time. That is, word lines are activated simultaneously and data are written by sense amplifiers during the burn-in test. In this case, a voltage applied to the word line, and a voltage for writing data is higher with respect to that in a normal operation.

FIG. 1 is a block diagram illustrating a conventional burn-in test operation of a semiconductor memory device.

Referring to FIG. 1, a memory cell array 10 has an open bit-line structure, and includes a plurality of memory cell areas and a plurality of sense amplifier columns. The memory cell areas are arranged on both sides, centering on the sense amplifier column. The sense amplifier columns and the memory cell areas are arranged in a matrix configuration. That is, the sense amplifier columns and the memory cell areas are arranged in both horizontal and vertical directions in relation to one another. The sense amplifier column includes a plurality of sense amplifier blocks S/A BLOCK. The sense amplifier block includes a sense amplifier, a pre-charger and the like. Burn-in voltage supply lines 11 and 12 are arranged in a direction along the sense amplifier column, respectively, and coupled to the sense amplifier blocks, respectively. Bit lines BL and BLB that are complementary to each other are extended to both sides of one sense amplifier block, approaching close to adjacent sense amplifier blocks. An interval between two bit lines in the sense amplifier block is about half of an interval between two bit lines in the memory cell area.

A plurality of word lines are extended in a vertical direction of the bit lines, and memory cells are formed at intersection regions of the word lines and the bit lines. Data '1' is stored in a cell coupled to the bit line BL when an applied voltage is high, and data '1' is stored in a cell coupled to the complementary bit line BLB when an applied voltage is high. That is, the cell coupled to the bit line BL corresponds to a true cell and the cell coupled to the complementary bit line BLB corresponds to a complementary cell. In a normal operation mode, the pre-charger receives a pre-charge voltage and provides a received pre-charge voltage to the bit lines according to a pre-charge signal PEQB.

The above-described structure of the memory cell arrays is referred to as an open bit-line structure. In comparison with a memory cell array having a folded bit-line structure, a memory cell array having an open bit-line structure has a disadvantage of noise that is generated from a bit line, a sensitivity of a sense amplifier, size, and the like, but has an advantage of a number of memory cells per unit area.

During a burn-in test, the word lines are activated simultaneously, a burn-in voltage VBL is applied to the pre-charger via the burn-in voltage supply lines 11 and 12, and the pre-charger provides the burn-in voltage VBL to the bit lines. In this case, the bit line BL 13 is provided with a first burn-in voltage VBL_ODD and the complementary bit line BLB 14 is provided with a second burn-in voltage VBL_EVEN. Thus, a memory cell 16 coupled to the bit line 13 is provided with the first burn-in voltage VBL_ODD and a memory cell 17 coupled to the complementary bit line 14 is provided with the second burn-in voltage VBL_EVEN. For example, the first burn-in voltage VBL_ODD corresponds to a power supply voltage VDD, and the second burn-in voltage VBL_EVEN corresponds to a reference voltage VSS. In case that a physical defect, such as a bridge, is generated between the memory cell 16 and the memory cell 17, the physical defect may be detected when a voltage difference of the burn-in voltages is wide. However, the memory cell 16 and the memory cell 18 are provided with a substantially identical burn-in voltage so that a physical defect between the memory cell 16 and the memory cell 18 may be difficult to detect.

The physical defect, such as the bridge, may be generated between the bit lines. When the bit line 13 is provided with a higher burn-in voltage, and the complementary bit line 14 is provided with a lower burn-in voltage, the physical defect may be detected due to a voltage difference between the burn-in voltages applied to the bit lines 13 and 14, respectively. However, the burn-in voltage applied to the bit line 13 is the substantially the same as the burn-in voltage applied to a bit line 15, so that the physical defect may not be detected.

Korean Patent Laid-Open Publication No. 1999-48397 discloses a method of applying different burn-in stress voltages in cells coupled to one word line, in a case where a memory cell array has a folded bit-line structure. In a conventional memory cell array having a folded bit-line structure, sense amplifier columns respectively include a pre-charge voltage supply line, and a pre-charge voltage is applied to the pre-charge voltage supply lines simultaneously by linking the pre-charge voltage supply lines. The method disclosed in Korean Patent Laid-Open Publication No. 1999-48397 includes applying different burn-in stress voltages to each pre-charge voltage supply line in a memory cell array having a folded bit-line structure, but cannot be applied to a memory cell array having an open bit-line structure.

SUMMARY OF THE INVENTION

Accordingly, the present invention is provided to substantially obviate one or more problems due to limitations and disadvantages of the related art.

Example embodiments of the present invention provide a semiconductor memory device capable of applying different voltages in cells coupled to adjacent bit lines during a burn-in test.

Example embodiments of the present invention provide a method for a burn-in test capable of applying different voltages in cells coupled to adjacent bit lines during a burn-in test of a semiconductor memory device.

According to one aspect, the present invention is directed to a semiconductor memory device which includes a row decoder, a memory cell array having an open bit-line structure, and a control circuit. The memory cell array includes a plurality of word lines coupled to the row decoder, a plurality of bit lines, a plurality of memory cells formed at intersection regions of the plurality of word lines and the plurality of bit lines, a plurality of sense amplifier blocks, and a plurality of burn-in voltage supply lines coupled to the plurality of sense amplifier blocks in a predetermined order, respectively. The control circuit controls the row decoder and the memory cell array for performing a burn-in test.

The burn-in voltage supply lines may be provided with at least two different burn-in voltages during the burn-in test.

The burn-in voltage supply lines respectively coupled to the sense amplifier blocks that are adjacent to each other may be provided with different burn-in voltages during the burn-in test.

A number of the burn-in voltage supply lines may be two, and the plurality of sense amplifier blocks may be alternately coupled to the burn-in voltage supply lines.

The control circuit may control the row decoder so as to alternately activate the word lines.

The sense amplifier block may include a pre-charge circuit, which is provided with a predetermined voltage, to pre-charge the bit lines to the predetermined voltage according to a pre-charge signal, and the pre-charge circuit may be provided with the predetermined voltage from the burn-in voltage supply line to provide the predetermined voltage to bit lines during the burn-in test.

The sense amplifier block may include an equalizer, which equalizes voltage levels of the bit lines, and the equalizer may be provided with the burn-in voltage from the burn-in voltage supply line to provide the burn-in voltage to the bit lines during the burn-in test.

According to another aspect, the invention is directed to a method for a burn-in test of a semiconductor memory device including a memory cell array having an open bit-line structure. The method of the invention includes applying at least two different burn-in voltages to a plurality of burn-in voltage supply lines, and applying the burn-in voltages to bit lines, respectively, via a plurality of sense amplifier blocks alternately coupled to the plurality of burn-in voltage supply lines in a predetermined order.

The method further includes alternately activating word lines of the memory cell array.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE EMBODIMENTS

Figure 1:
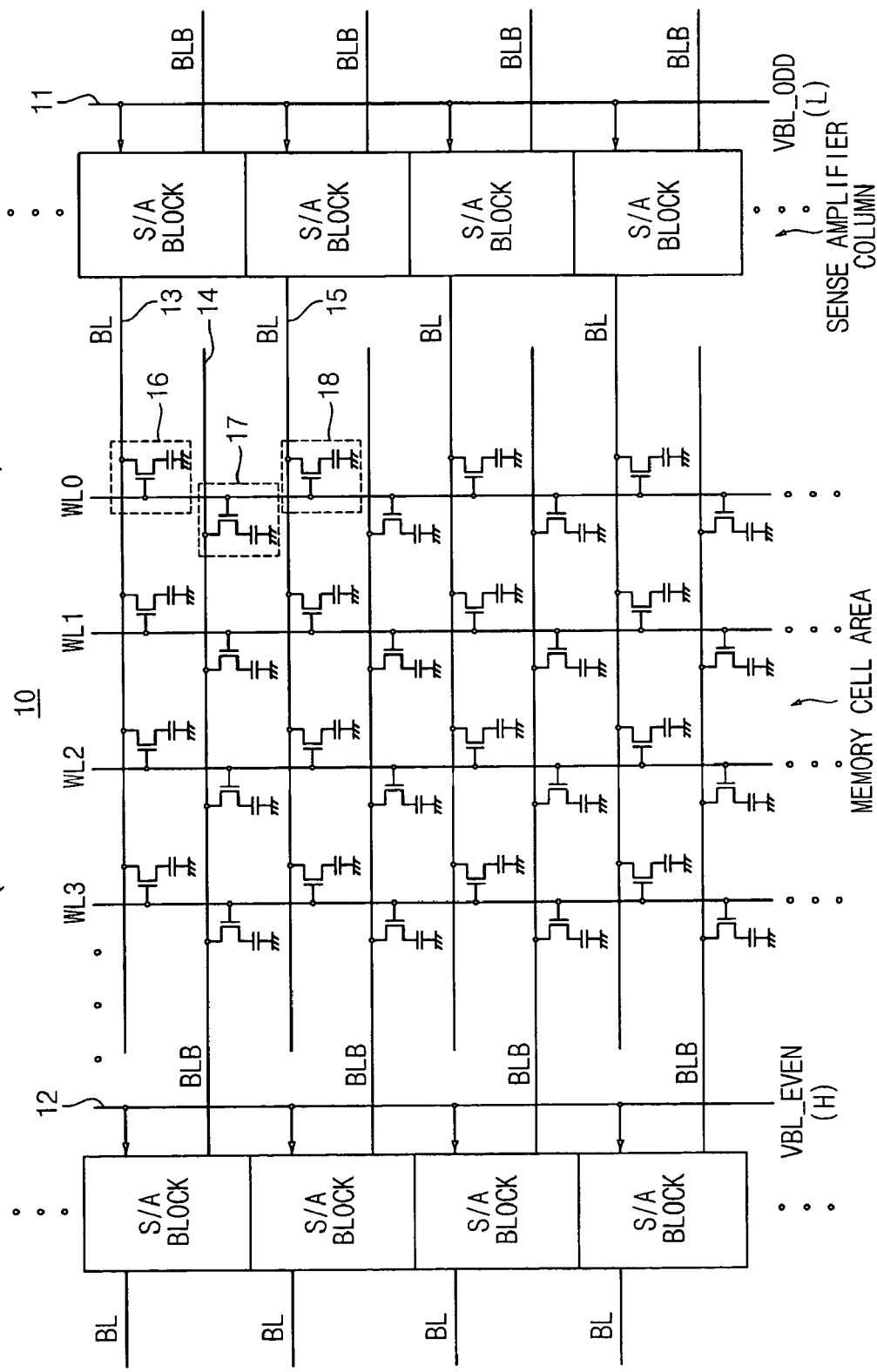
FIG. 1 is a block diagram illustrating a conventional burn-in test operation of a semiconductor memory device.

Detailed illustrative embodiments of the present invention are disclosed herein. However, specific structural and functional details disclosed herein are merely representative for purposes of describing example embodiments of the present invention. This invention may, however, be embodied in many alternate forms and should not be construed as limited to the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

Figure 2:
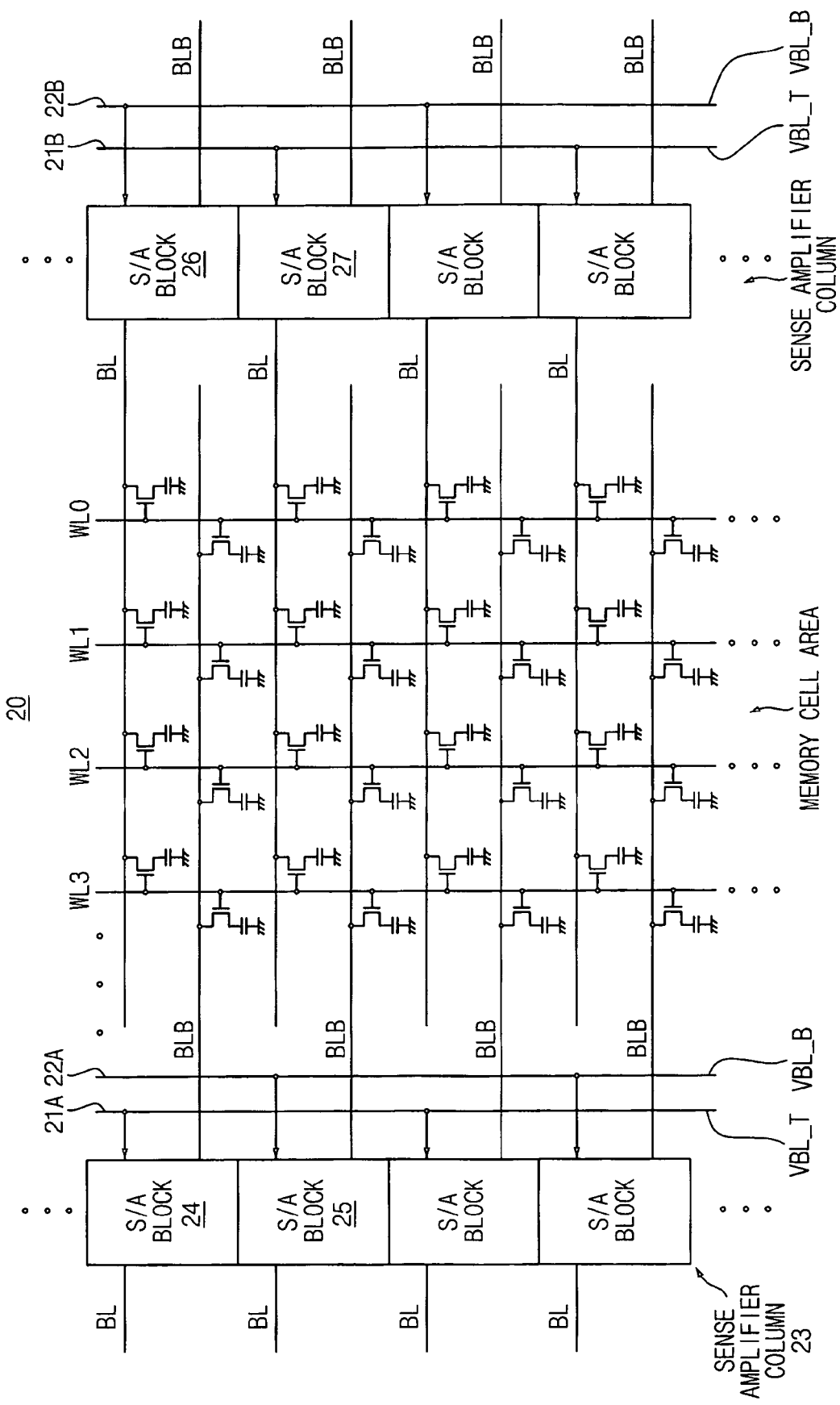
FIG. 2 is a circuit diagram illustrating a memory cell array according to an example embodiment of the present invention.

FIG. 2 is a circuit diagram illustrating a memory cell array in a semiconductor memory device according to an example embodiment of the present invention.

Referring to FIG. 2, a memory cell array 20 has an open bit-line structure substantially similar to that of FIG. 1, and may include a plurality of sense amplifier columns and a plurality of memory cell areas. The memory cell areas may be arranged on both sides, centering on the sense amplifier column 23. The sense amplifier column 23 may include a plurality of sense amplifier blocks S/A BLOCK.

The memory cell array may include a first burn-in voltage supply line 21A and a second burn-in voltage supply line 22A that are arranged in a direction along the sense amplifier column 23. The first and the second burn-in voltage supply lines 21A and 22A may be alternately coupled to the sense amplifier blocks. For example, the first burn-in voltage supply line 21A is coupled to an odd-numbered sense amplifier block 24 and the second burn-in voltage supply line 22A is coupled to an even-numbered sense amplifier block 25. In this case, the sense amplifier blocks that are adjacent to each other may be provided with different burn-in voltages, respectively, so that the memory cells arranged between the sense amplifier blocks that are adjacent to each other may be provided with different burn-in voltages. For example, the sense amplifier blocks 24 and 26 are coupled to first and fourth burn-in voltage supply lines 21A and 22B, respectively, to be provided with different burn-in voltages VBL_T and VBL_B, respectively.

The first and the second burn-in voltage supply lines 21A and 22A may be electrically isolated so as to be provided with different burn-in voltages according to a burn-in test pattern.

In example embodiments, the memory cell array may include three or more burn-in voltage supply lines. For example, when the memory cell array includes four burn-in voltage supply lines, each burn-in voltage supply line may be coupled to one sense amplifier block every four sense amplifier blocks. That is, four burn-in voltages are applied to the sense amplifier blocks so that burn-in tests may be variously performed.

Figure 3:
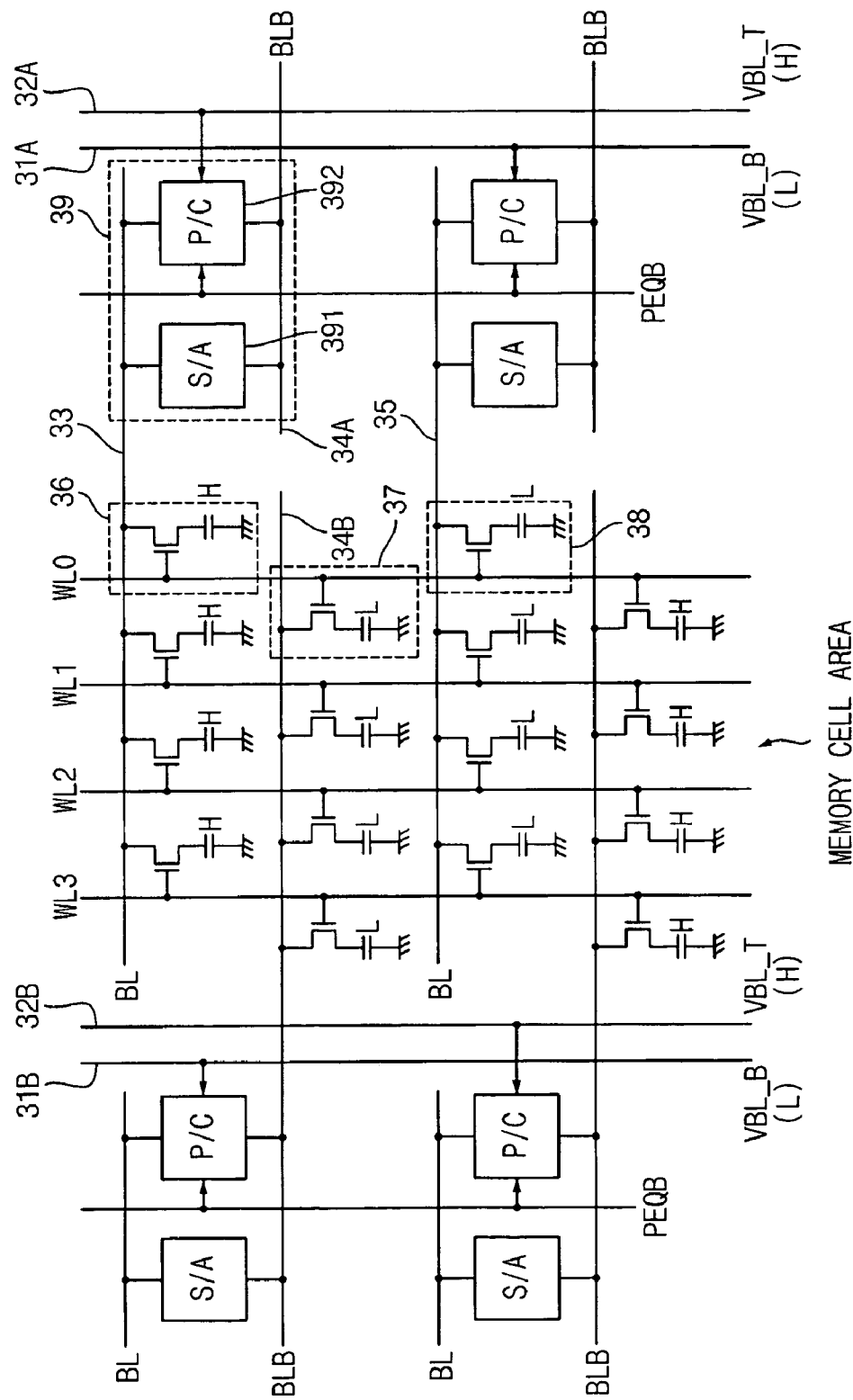
FIG. 3 is a detailed circuit diagram illustrating the memory cell array in FIG. 2 according to one example embodiment of the present invention.

FIG. 3 is a detailed circuit diagram illustrating the memory cell array in FIG. 2 according to one example embodiment of the present invention.

The operation of the memory cell array in FIG. 2 during a burn-in test will be described with reference to FIG. 3.

A sense amplifier block 39 may include a sense amplifier 391 and a pre-charger 392. The pre-charger 392 may equalize voltage levels between a pair of bit lines BL and BLB coupled to the pre-charger 392 according to a pre-charge signal PEQB. In this case, equalized voltage levels of the pair of bit lines BL and BLB may be determined based on burn-in voltages VBL_T and VBL_B applied to burn-in voltage supply lines 31A and 32A. When a semiconductor memory circuit operates normally, the burn-in voltage supply lines 31A and 32A may be used for applying voltages to the pre-charge circuit 392. That is, the pre-charger 392 may charge the pair of bit lines BL and BLB by using voltages applied to the burn-in voltage supply lines.

When a burn-in test is started, every word line WL0, WL1, WL2 and WL3 may be activated. According to the pre-charge signal PEQB, voltage levels of an associated pair of bit lines BL and BLB may be equalized and the associated pair of bit lines BL and BLB may be coupled to the burn-in voltage supply lines 31A and 32A. The burn-in voltage supply lines 31A and 32A may be alternately provided with different burn-in voltages VBL_T and VBL_B. Thus, a pair of bit lines 33 and 34A extended from an odd-numbered sense amplifier block may be charged to a first burn-in voltage VBL_T, and a bit line 35 extended from an even-numbered sense amplifier block may be charged to a second burn-in voltage VBL_B.

A physical defect such as a bridge may occur between the bit lines. Particularly, the physical defect may often occur in a sense amplifier block area where a space between the bit lines is narrower. The different burn-in voltages VBL_T and VBL_B may be applied to the bit line 33 and the complementary bit line 34B, respectively, so that the physical defect between the bit lines 33 and 34B may be detected. In addition, the different burn-in voltages VBL_T and VBL_B may be applied to the bit lines 33 and 35, respectively, so that the physical defect between the bit lines 33 and 35 may be detected.

The physical defect such as the bridge may occur between memory cells. The physical defect between memory cells may be detected by a common method of detecting the physical defect between bit lines.

During the burn-in test, memory cells coupled to bit lines extended from the odd-numbered sense amplifier block may be provided with a first burn-in voltage to write data '1', namely, a logical high state, and memory cells coupled to bit lines extended from the even-numbered sense amplifier block may be provided with a second burn-in voltage to write data '0', namely, a logical low state. The first burn-in voltage is higher than the second burn-in voltage.

Particularly, among adjacent memory cells 36, 37 and 38 coupled to one word line, the memory cells 36 and 38 correspond to true cells and the memory cell 37 corresponds to a complementary cell. That is, the memory cells 36 and 38 are provided with a higher bit line voltage to store data '1', and the memory cell 37 is provided with a lower bit line voltage to store data '1'. The memory cell 36 and the memory cell 37 are coupled to different burn-in voltage supply lines 32A and 31B, respectively, to write data using different burn-in voltages, and the defect between the memory cells 36 and 37 may be detected easily during the burn-in test. Both the memory cell 36 and the memory cell 38 are coupled to one sense amplifier column and have a substantially identical data topology, namely, a true cell. However, the memory cells 36 and 38 are provided with different burn-in voltages from the burn-in voltage supply lines 32A and 31A, respectively, so that the defect between the memory cells 36 and 38 may be easily detected.

In example embodiments, word lines in the memory cell array may be not activated simultaneously but be activated alternately during the burn-in test. In this case, the physical defect between cells coupled to adjacent word lines, respectively, may be detected. Thus, burn-in test patterns may be variously performed.

Figure 4:
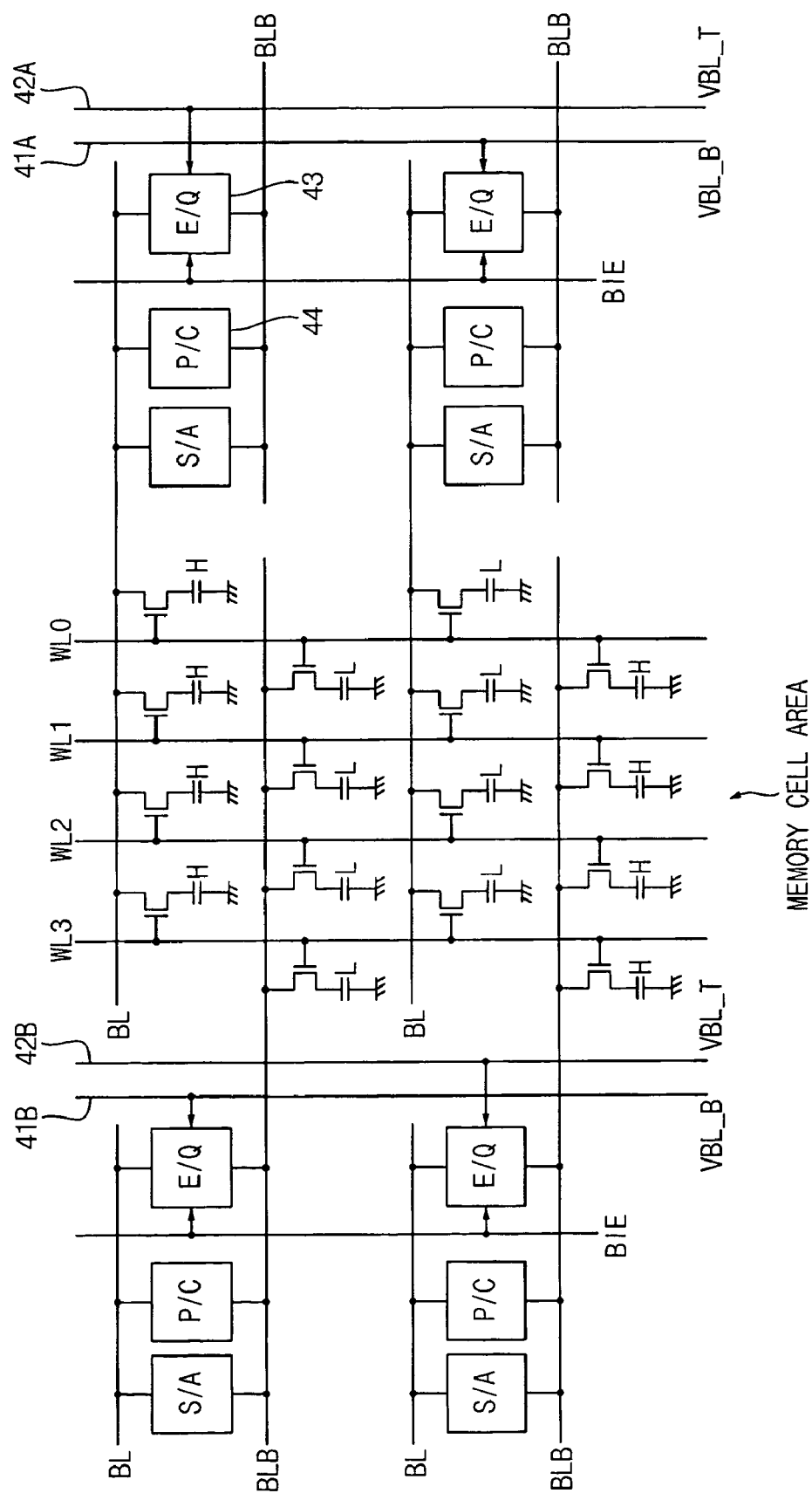
FIG. 4 is a detailed circuit diagram illustrating the memory cell array in FIG. 2 according to another example embodiment of the present invention.

FIG. 4 is a detailed circuit diagram illustrating the memory cell array in FIG. 2 according to another example embodiment of the present invention.

Referring to FIG. 4, burn-in voltage supply lines 41A and 42A may be coupled not to a pre-charger 44 but an equalizer 43, and a burn-in test may be performed by burn-in voltages VBL_T and VBL_B according to a burn-in signal BIE. The operation of a memory cell array in FIG. 4 is substantially the same as that of a memory cell array in FIG. 3, so that further description will not be repeated.

Figure 5:
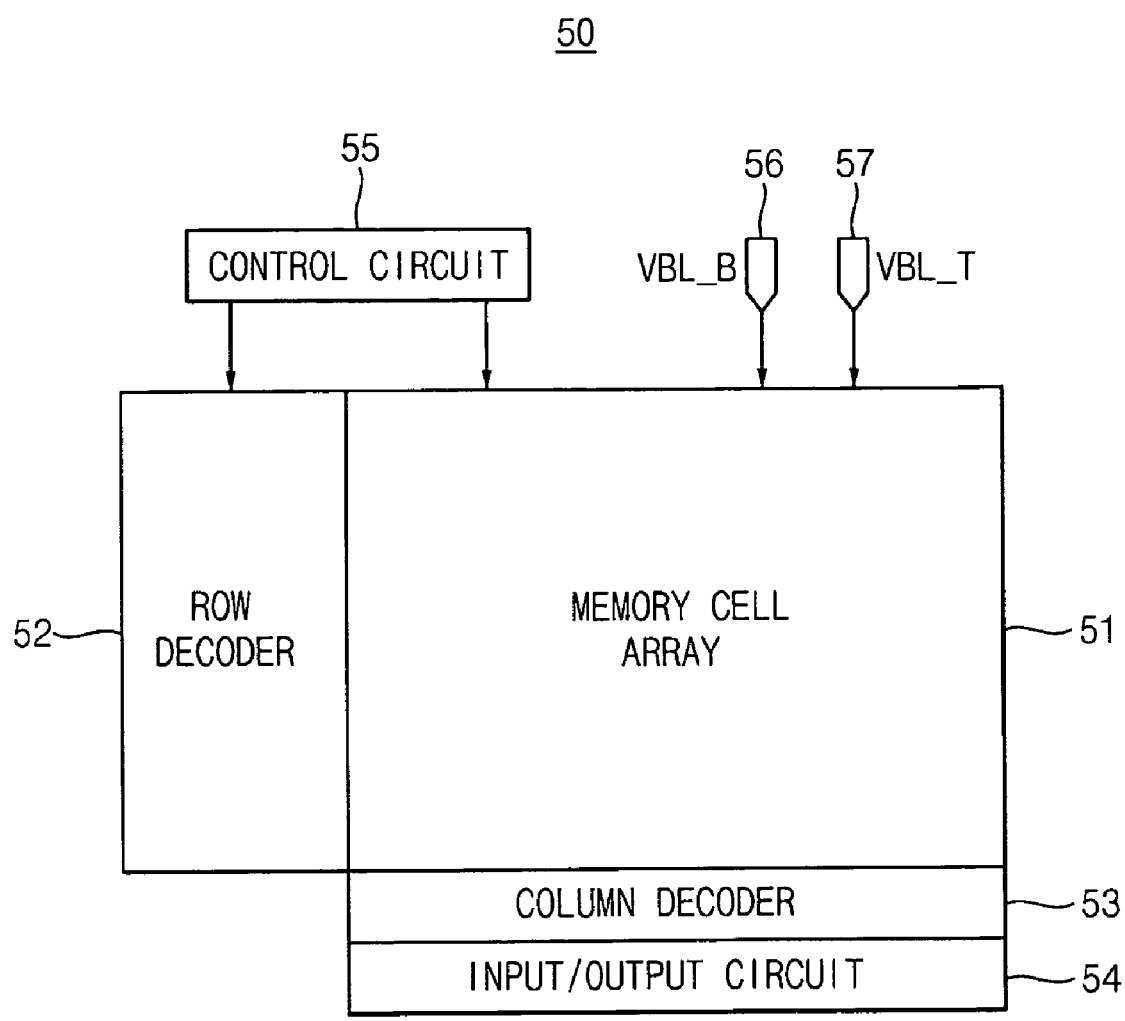
FIG. 5 is a block diagram illustrating a semiconductor memory device according to an example embodiment of the present invention.

FIG. 5 is a block diagram illustrating a semiconductor memory device according to an example embodiment of the present invention.

Referring to FIG. 5, a semiconductor memory device 50 may include a memory cell array 51 shown in FIG. 2, a row decoder 52, a column decoder 53, an input/output circuit 54, a control circuit 55, and burn-in voltage pins 56 and 57. The burn-in voltage pins 56 and 57 may respectively receive burn-in voltages VBL_B and VBL_T from a burn-in test device to apply the burn-in voltages VBL_B and VBL_T to the memory cell array 51. The control circuit 55 may control the memory cell array 51 and the row decoder 52 for performing a burn-in test.

As described above, the semiconductor memory device according to example embodiments of the present invention may have an open bit-line structure, and may include at least two burn-in voltage supply lines so as to alternately apply different burn-in voltages to bit lines.

Therefore, the semiconductor memory device according to example embodiments of the present invention may detect a physical defect between adjacent bit lines and between adjacent cells coupled to one word line, which have a substantially identical data topology.

Having thus described example embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A semiconductor memory device comprising:
    a row decoder;
    a memory cell array having an open bit-line structure and including a plurality of word lines coupled to the row decoder, a plurality of bit lines, a plurality of memory cells formed at intersection regions of the plurality of word lines and the plurality of bit lines, a plurality of sense amplifier blocks, and a plurality of burn-in voltage supply lines coupled to the plurality of sense amplifier blocks in a predetermined order, respectively; and
    a control circuit configured to control the row decoder and the memory cell array for performing a burn-in test.

2. The semiconductor memory device of claim 1, wherein the burn-in voltage supply lines are provided with at least two different burn-in voltages during the burn-in test.

3. The semiconductor memory device of claim 2, wherein the burn-in voltage supply lines respectively coupled to the sense amplifier blocks that are adjacent to each other are provided with different burn-in voltages during the burn-in test.

4. The semiconductor memory device of claim 3, wherein a number of the burn-in voltage supply lines is two, and the plurality of sense amplifier blocks are alternately coupled to the burn-in voltage supply lines.

5. The semiconductor memory device of claim 1, wherein the control circuit controls the row decoder so as to alternately activate the word lines.

6. The semiconductor memory device of claim 1, wherein the sense amplifier block comprises a pre-charge circuit, which is provided with a predetermined voltage, to pre-charge the bit lines to the predetermined voltage according to a pre-charge signal, the pre-charge circuit being provided with the predetermined voltage from the burn-in voltage supply line to provide the predetermined voltage to bit lines during the burn-in test.

7. The semiconductor memory device of claim 1, wherein the sense amplifier block comprises an equalizer, which equalize voltage levels of the bit lines, the equalizer being provided with the burn-in voltage from the burn-in voltage supply line to provide the burn-in voltage to the bit lines during the burn-in test.

8. A method for a burn-in test of a semiconductor memory device including a memory cell array having an open bit-line structure, the method comprising:
    applying at least two different burn-in voltages to a plurality of burn-in voltage supply lines; and
    applying the burn-in voltages to bit lines, respectively, via a plurality of sense amplifier blocks alternately coupled to the plurality of burn-in voltage supply lines in a predetermined order.

9. The method of claim 8 further comprising alternately activating word lines of the memory cell array.

* * * * *